(12) United States Patent
Baek et al.

(10) Patent No.: US 7,071,491 B2
(45) Date of Patent: Jul. 4, 2006

(54) TO-CAN TYPE OPTICAL MODULE

(75) Inventors: Jae-Myung Baek, Suwon-shi (KR); Ho-Seong Seo, Suwon-shi (KR); Mun-Kue Park, Suwon-shi (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 15 days.

(21) Appl. No.: 10/657,839

(22) Filed: Sep. 9, 2003

(65) Prior Publication Data
US 2004/0202432 A1 Oct. 14, 2004

(30) Foreign Application Priority Data
Apr. 14, 2003 (KR) .................. 10-2003-0023464

(51) Int. Cl.
*H01L 29/267* (2006.01)
(52) U.S. Cl. .................. 257/81; 257/82; 257/99; 257/433
(58) Field of Classification Search .............. 257/81, 257/82, 99, 433; 385/88, 92–94; 372/50, 372/50.1
See application file for complete search history.

(56) References Cited

U.S. PATENT DOCUMENTS

| 3,946,416 | A | 3/1976 | Hacskaylo | 357/17 |
| 4,309,717 | A | 1/1982 | Cardinal | 357/74 |
| 6,074,102 | A * | 6/2000 | Oikawa | 385/88 |
| 6,836,492 | B1 * | 12/2004 | Ido et al. | 372/36 |
| 2004/0247259 | A1 * | 12/2004 | Blom | 385/92 |

FOREIGN PATENT DOCUMENTS

| EP | 0825653 A2 | 2/1998 |
| JP | 11238916 | 8/1999 |
| JP | 2001196682 | 7/2001 |
| WO | WO 02/078409 | * 10/2002 |

* cited by examiner

*Primary Examiner*—Minh-Loan Tran
(74) *Attorney, Agent, or Firm*—Cha & Reiter, L.L.C.

(57) ABSTRACT

A TO-CAN type optical module for used in an optical communication is disclosed. The optical module includes: a stem provided with optical components mounted on its upper surface and a through hole formed therethrough; a plurality of pins electrically connected to the optical components via the through hole and having a signal-carrying pin protruding from the lower surface of the stem; and a pair of ground pins spaced at both sides from a protruding portion of the signal-carrying pin. The interior of the through hole of the stem has a desired characteristic impedance by the impedance matching of a coaxial cable, and the lower surface of the stem has a desired characteristic impedance by the dimensions of the protruding portion of the signal-carrying pin and the ground pins and the interval between the protruding portion of the signal-carrying pin and the ground pins.

20 Claims, 8 Drawing Sheets

(PRIOR ART)

(PRIOR ART)

TO-CAN TYPE OPTICAL MODULE

CLAIM OF PRIORITY

This application claims priority to an application entitled "TO-CAN TYPE OPTICAL MODULE," filed in the Korean Intellectual Property Office on Apr. 14, 2003 and assigned Ser. No. 2003-23464, the contents of which are hereby incorporated by reference.

BACKGROUND OF THE INVENTION

1. Field of the Invention

The present invention relates to an optical module, and more particularly to a TO-CAN type optical module employing a TO-CAN type package.

2. Description of the Related Art

An optical module plays an important role in exchanging optical and electrical signals. As the demand for a faster data transmission rate has been increased rapidly, an optical module capable of transmitting a wide bandwidth of frequencies is needed. The optical modules typically include transmitters for converting an electrical signal into an optical signal for subsequent transmission and receivers for converting the transmitted optical signal into an electrical signal.

Alternatively, a transceiver maybe used as an optical module. In the transceiver, the electrical signal and the optical signal are interchanged using a laser diode (LD) and a photo diode (PD). These LD and PD are installed separately, then sealed in a single package. A TO-CAN type package is most economical and thus used widely as an optical module package.

Figure 1:
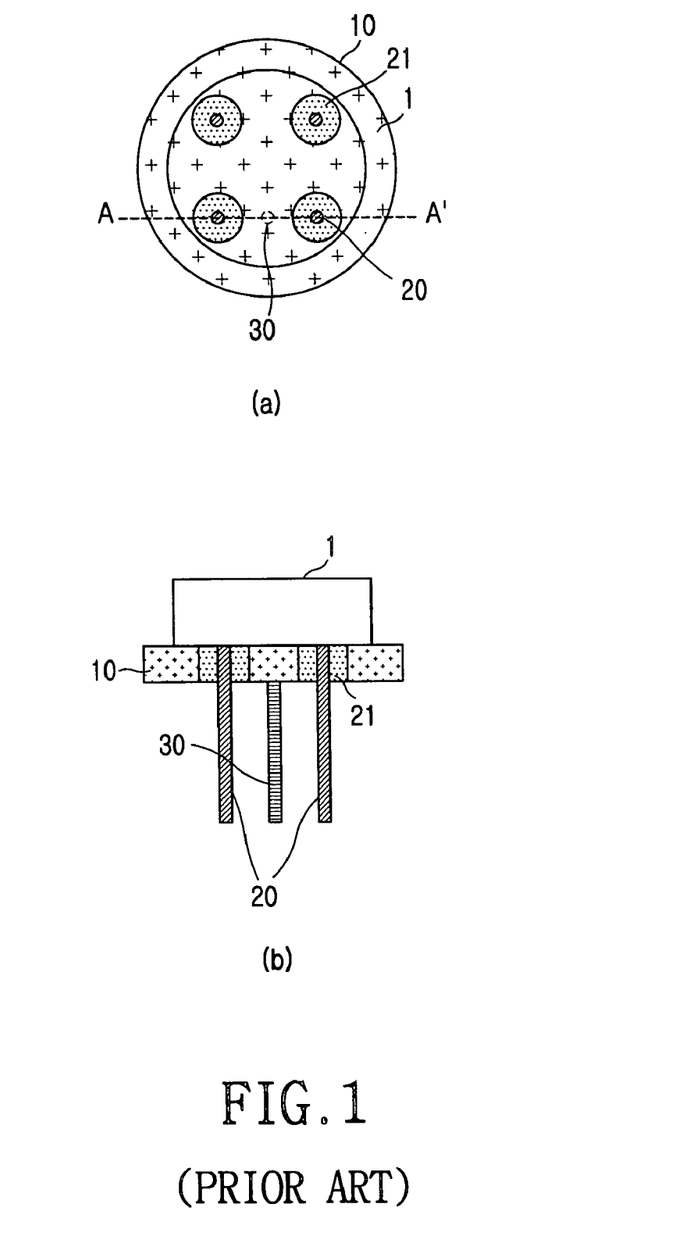
FIGS. 1a and 1b are schematic views of a conventional TO-CAN type optical module.
Figure 2:
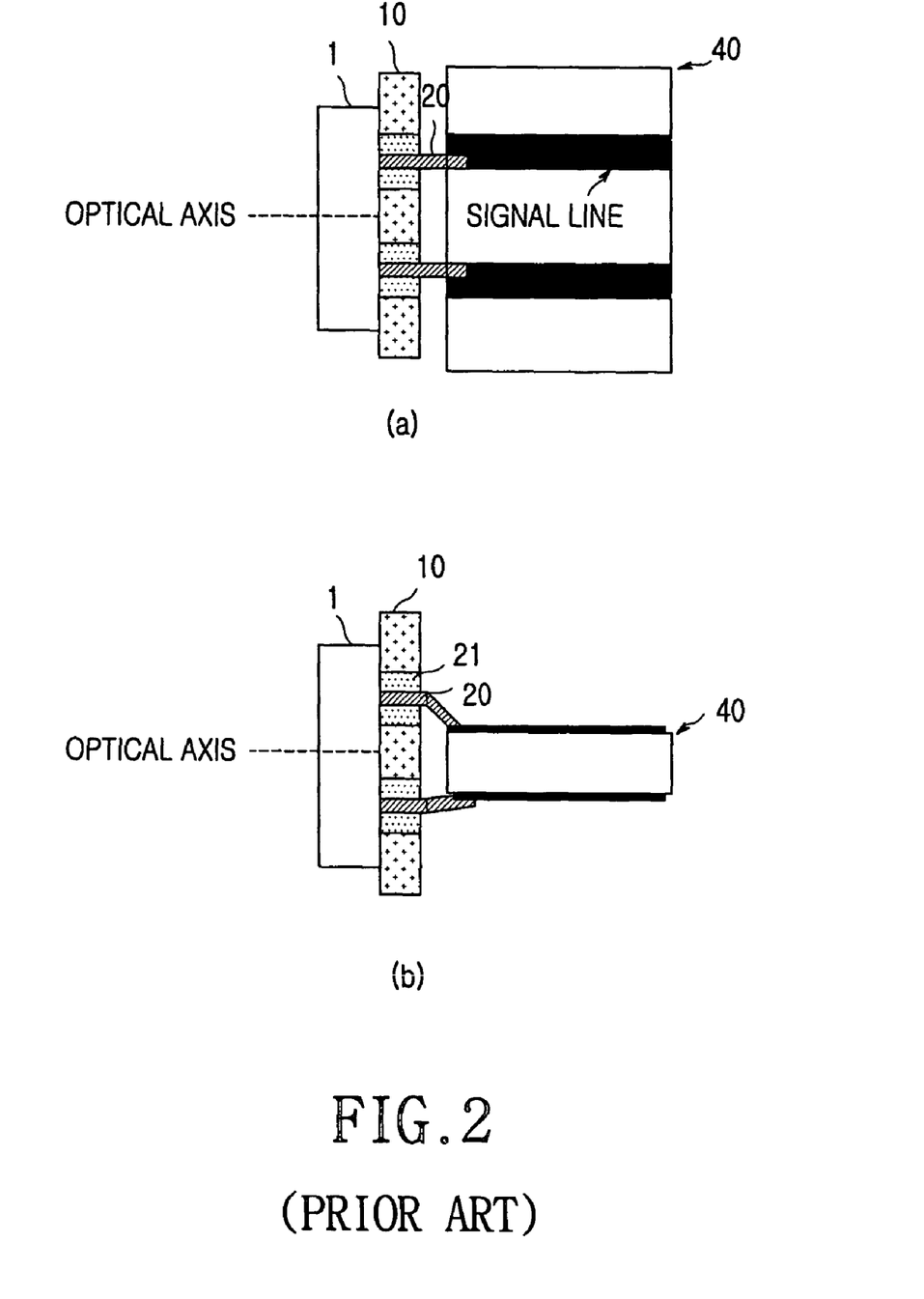
FIGS. 2a and 2b are schematic cross-sectional views illustrating a connection between the TO-CAN type package of FIG. 1 and a printed circuit board (PCB) for signal processing.
Figure 3:
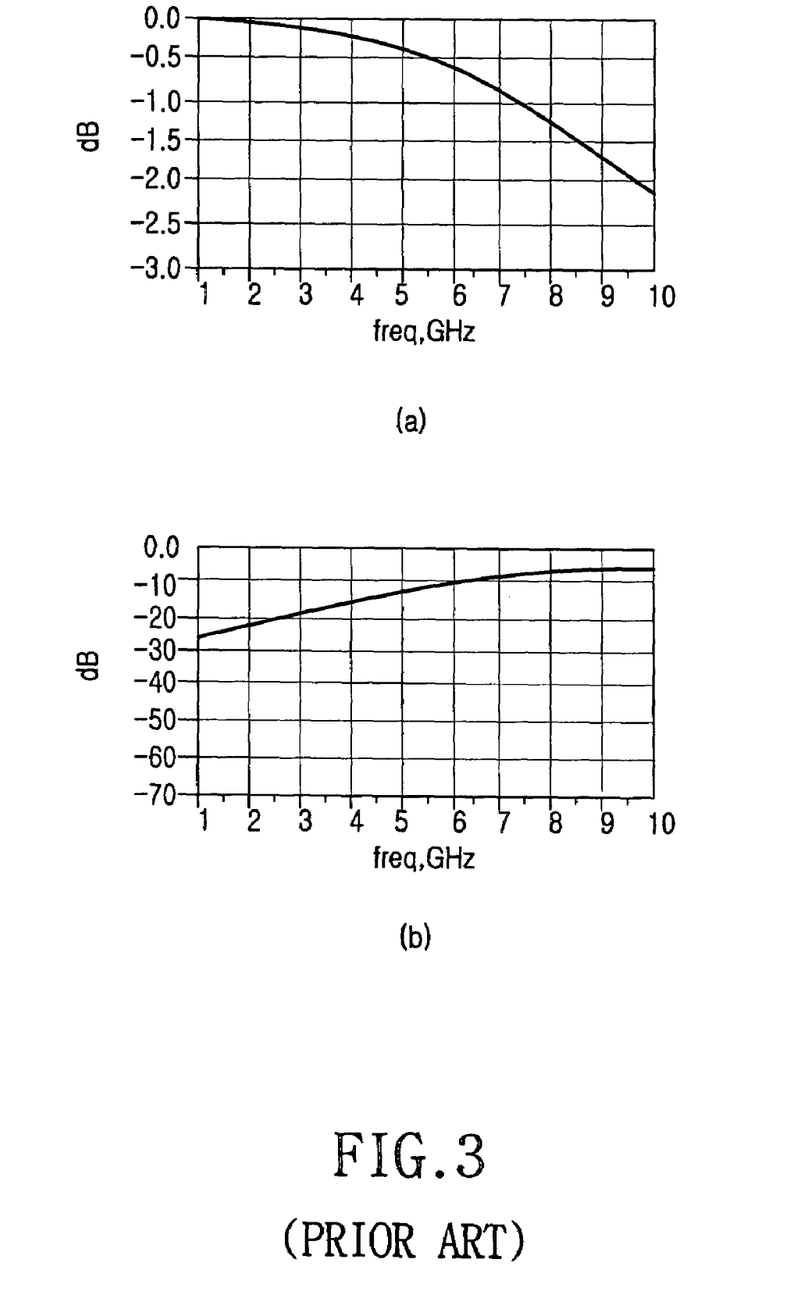
FIGS. 3a and 3b are graphs illustrating a high-frequency property of a conventional TO-CAN type package (T056)

FIGS. 1a and 1b are schematic views of a conventional TO-CAN type package. In particular, FIG. 1a is a plan view of the conventional TO-CAN type package, and FIG. 1b is a cross-sectional view taken along the line A–A' of FIG. 1a. FIGS. 2a and 2b illustrates a connection between the TO-CAN type package of FIG. 1 and a printed circuit board (PCB) 40 for signal processing. In FIGS. 1a, 1b, 2a and 2b, optical components mounted on a stem in the TO-CAN type package are omitted and only the stem and pins are shown. FIGS. 3a and 3b are graphs illustrating a high-frequency property of a conventional TO-CAN type package (T056), and more specifically, FIG. 3a represents a gain property, and FIG. 3b represents a matching property. In the drawings, a non-described reference number 1 denotes a cap.

With reference to FIGS. 1a, 1b, 2a, and 2b, the conventional TO-CAN type package comprises a stem 10, which is provided with optical components (not shown) such as a LD and matching resistors for transmitter and a PD and TIA (Transimpedance Amplifier) for receiver mounted on its upper surface, signal-carring pins 20, and a ground pin 30 passing through the stem 10 so that the signal-carrying pins 20 and the ground pin 30 are connected to the optical components.

Note that the characteristic impedance of each of portions 21 sealed with the glass in the TO-CAN type package is very low, i.e., 20Ω, and the inductance of each of the pins 20 and 30 protruding from the stem 10 is high. Accordingly, a high frequency signal of 50Ω in transmission must be attenuated in the TO-CAN type package. When the electrical signal of the TO-CAN type package is transmitted to an external substrate at a data transfer rate of less than 2.5 Gb/s, the best way to enable communication is to shorten the length of the pins 20 and 30 as much as possible. Particularly, at a date transfer rate of more than 10 Gb/s, a very small distance of 1 mm between the stem 10 and the printed circuit board (PCB) 40 degrades the signal severely when the TO-CAN type package is mounted on the PCB 40, which is manufactured with a signal line with a characteristic impedance of 50Ω. Accordingly, it is very important to attach the stem 10 close to the printed circuit board 40.

In a system provided with a TO-CAN type optical module, since an optical axis of a transmitter coincides with an optical axis of a receiver, pins of the TO-CAN type optical module require a uniform length in consideration of the difference between the positions of the signal-carrying pins of each of the modules (the distances from each of the optical axes) and the variation generated in manufacturing the module. As a result, a signal loss at 10 GHz, which is more than 2 dB, is generated due to the structures of glass-sealed portions and the lengths of the pins (in FIG. 3a), thereby reducing the bandwidth and lowering the matching property of the optical module, as shown in FIG. 3b.

SUMMARY OF THE INVENTION

The present invention overcomes the above-described problems and provides additional advantages, by providing a TO-CAN type optical module in which a signal is attenuated at minimum even at a high frequency and provides an excellent matching property.

In one aspect, the present invention provides a TO-CAN type optical module in which a desired characteristic impedance is maintained regardless of the length of pins protruding from the lower surface of a stem.

In another aspect, an optical module is provided and includes: a stem provided with optical components mounted on its upper surface, and a through hole formed therethrough; a plurality of pins electrically connected to the optical components via the through hole, the pins including a signal-carrying pin protruding from the lower surface of the stem; and, a pair of ground pins spaced at both sides from a protruding portion of the signal-carrying pin. The interior of the hole in the stem has a desired characteristic impedance through the impedance matching of a coaxial cable, and the lower surface of the stem has a desired characteristic impedance due to the dimensions of the protruding portion of the signal-carrying pin and the ground pins as well as the interval between the protruding portion of the signal-carrying pin and the ground pins.

Preferably, the signal-carrying pin may include a cylindrical portion passing through the stem and a hexahedral portion protruding from the lower surface of the stem.

More preferably, in case the interval between the protruding portion of the signal-carrying pin and the ground pins is smaller than the distance between the signal lines and the ground lines of a PCB for mounting the signal-carrying pin and the ground pins thereon, edges of the ground pins may be removed partially so as to prevent the occurrence of shorts when the signal-carrying pins and the ground pins are connected to the signal lines and the ground lines.

In further aspect, a ground property of the module may be improved by increasing the dimensions of the ground pins.

BRIEF DESCRIPTION OF THE DRAWINGS

The above features and other advantages of the present invention will become more clearly understood from the following detailed description taken in conjunction with the accompanying drawings, in which.

DETAILED DESCRIPTION OF THE PREFERRED EMBODIMENTS

Now, preferred embodiments of the present invention will be described in detail with reference to the annexed drawings. In the drawings, the same or similar elements are denoted by the same reference numerals even though they are depicted in different drawings. For the purposes of clarity and simplicity, a detailed description of known functions and configurations incorporated herein will be omitted as it may make the subject matter of the present invention unclear.

FIGS. 4a to 4c are schematic views of a TO-CAN type package in accordance with a preferred embodiment of the present invention. More specifically, FIG. 4a is a plan view of the TO-CAN type package, FIG. 4b is a cross-sectional view taken along the line B–B' of FIG. 4a, and FIG. 4c is a cross-sectional view taken along the line C–C' of FIG. 4b.

Figure 8:
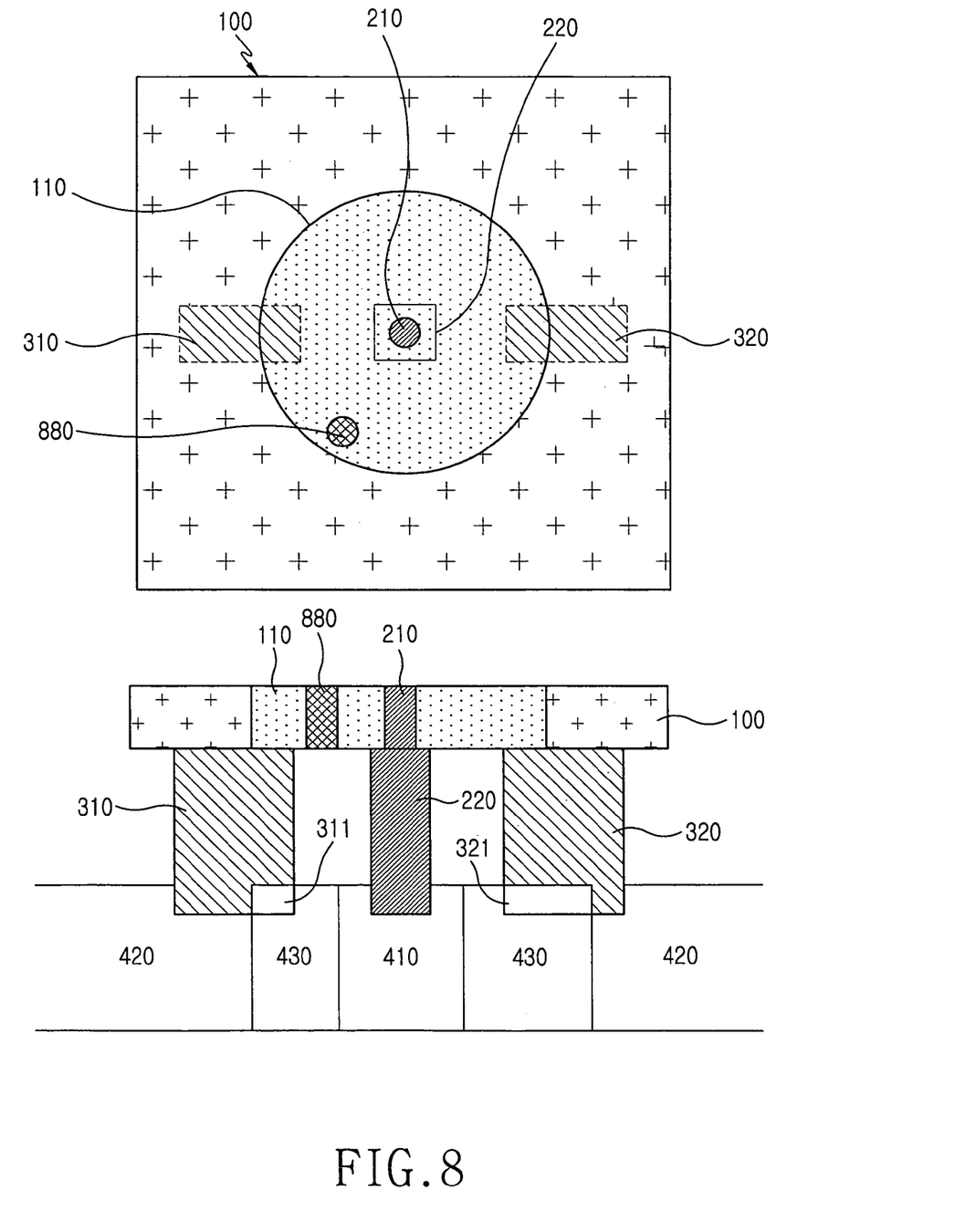

For simplicity, only one signal-carrying pin is discussed in the specification, but it is to be understood that the present invention can support a much larger number of pins. For example, current invention can also support additional pin 880 that is electrically connected to optical components via hole, as shown in FIG. 8.

As shown, the TO-CAN type package according to the embodiment of the present invention includes a stem 100, a signal-carrying pin 200, and ground pins 310 and 320.

Optical components (not shown), such as a LD, a PD, etc., may be mounted on the upper surface of the stem 100. A through hole 110 (for example, with a diameter of 1,100 μm) is formed through the stem 100.

The signal-carrying pin 200 is electrically connected to the optical components via the through hole 110. The signal-carrying pin 200 includes a cylindrical pin 210 and a hexahedral pin 220 connected to the cylindrical pin 210. The cylindrical pin 210 has a diameter of 200 μm and a length (L2) of 1,000 μm. The hexahedral pin 220 has a width (W) of 400 μm, a thickness (H) of 400 μm, and a length (L1) of 2,000 μm.

The cylindrical pin 210 is fixed in the through hole 110 by sealing the through hole with a glass sealing powder, and the hexahedral pin 220 is protruded from the lower surface of the stem 100. Here, the glass-sealed interior of the through hole 110 is designed to have a characteristic impedance of 50Ω by the impedance matching of a coaxial waveguide. Note that there are variable kinds of waveguide for delivery without diminishing a signal such as a microstrip line, a coplanar waveguide, a coaxial waveguide, etc., but the coaxial waveguide is the most generally used. The present invention has a structure of coaxial waveguide because the signal-carrying pin 200 and the through hole 110 comprise the same axial and the stem is ground. In order to reduce a capacitance per unit length and to match impedance with acceptable size, an glass with a small permittivity of approximately 4.1 is selectively used. Note that a characteristic impedance ($Z_0$) generated by the impedance matching of the coaxial waveguide shown in FIG. 4a is obtained by the below Equation 1.

$$Z_0=1/(2\pi)*\sqrt{(\mu/\epsilon)}*1n(b/a) \qquad [\text{Equation 1}]$$

Here, μ represents the permeability of a dielectric material, ε represents the permittivity of a dielectric material, a represents the diameter of a signal-carrying pin, and b represents the diameter of a through hole.

The ground pins 310 and 320 disposed at both sides of the signal-carrying pin 200 are spaced from the hexahedral pin 220 of the signal-carrying pin 200 that is protruding from the lower surface of the stem 100 by a designated interval (S). The ground pins 310 and 320 have larger dimensions (for example, a width (W1) of 1,000 μm and a thickness (H) of 400 μm) than the conventionally used cylindrical pin so as to increase the ground dimensions, and are spaced from the hexahedral pin 220 by an internal (S) of about 200 μm.

The characteristic impedance of the hexahedral pin 220 protruding from the lower surface of the stem 100 is determined by the thickness (H) and width (W) of the hexahedral pin 220, the thickness and width of the ground pins 310 and 320, and the interval (S) between the hexahedral pin 220 and the ground pins 310 and 320.

Accordingly, the desired characteristic impedance, i.e., 50Ω, can be obtained by controlling the dimensions and thicknesses of the pins 220, 310 and 320, and the interval between the pin 220 and the pins 310 and 320, but is not limited to the above-described exemplary value.

Figure 4:
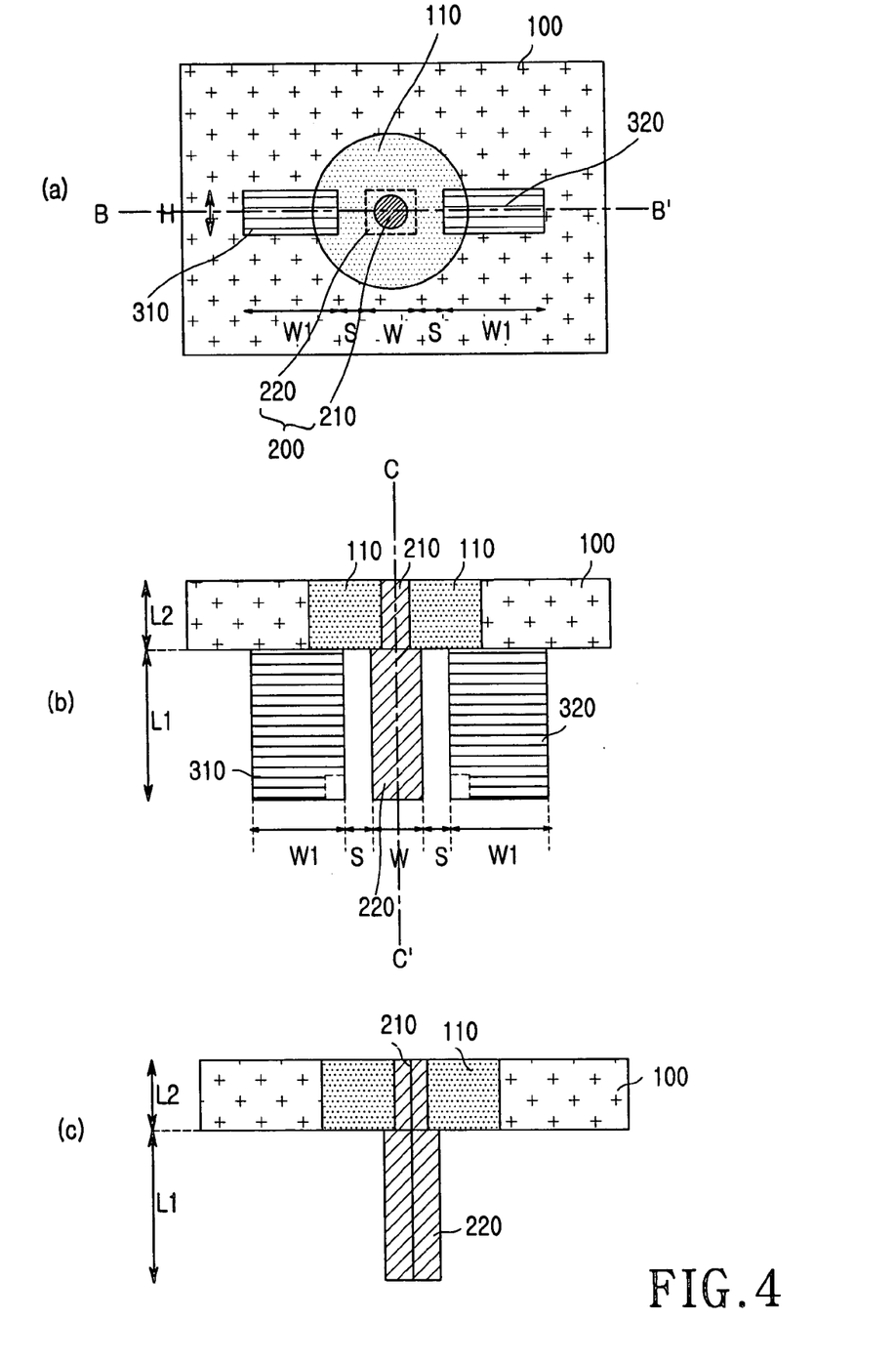
FIGS. 4a to 4c are schematic views of a TO-CAN type package in accordance with a preferred embodiment of the present invention.
Figure 5:
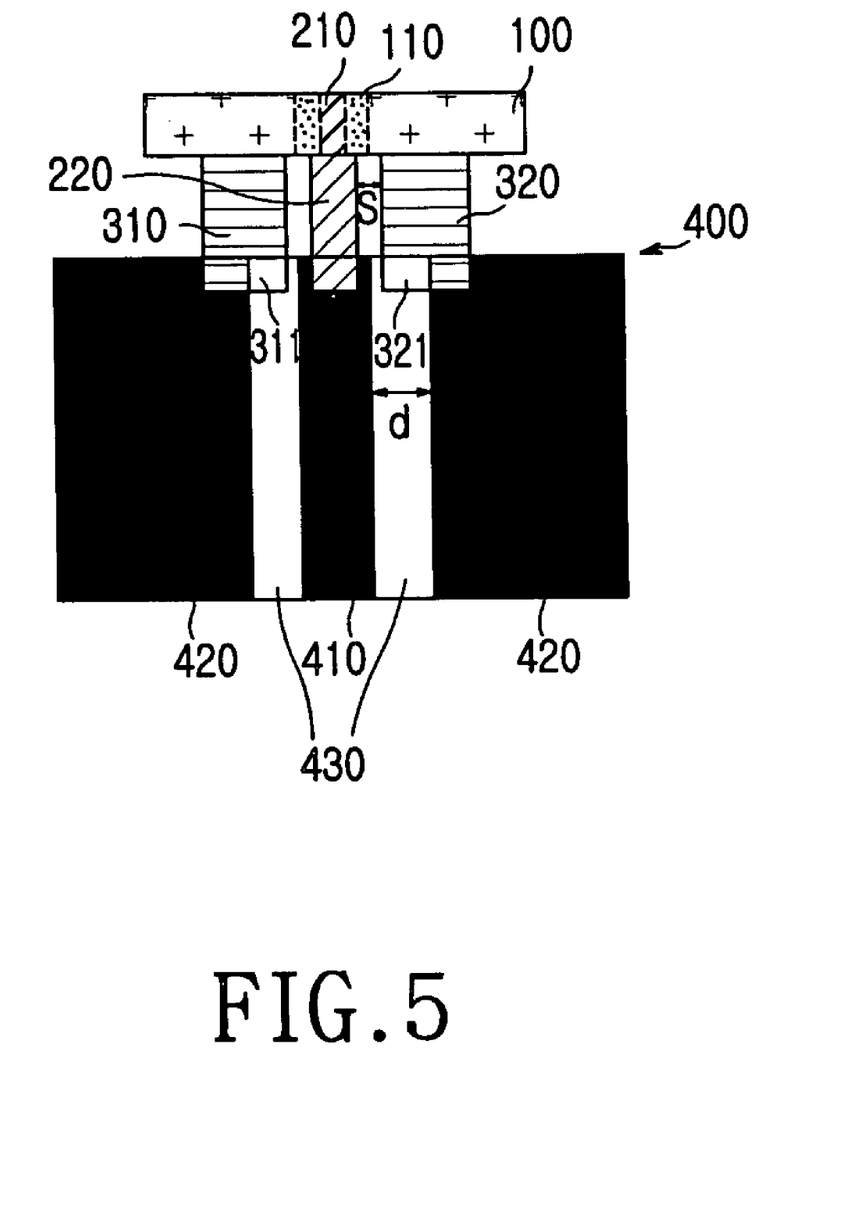
FIG. 5 is a schematic cross-sectional view illustrating a connection between the TO-CAN type package of FIG. 4 and a printed circuit board (PCB) for signal processing.

FIG. 5 is a schematic cross-sectional view illustrating a connection between the TO-CAN type package of FIG. 4 and a printed circuit board (PCB). As shown, the PCB 400 includes a signal line 410 and ground lines 420. The signal lines 410 and the ground lines 420 are disposed on a dielectric substrate 430.

Generally, an impedance (Z) is represented by the equation of $Z=\sqrt{L/C}$. As such, the impedance ($Z_0$) of the PCB 400 is determined by the relative permittivity ($\epsilon_r$) of the dielectric substrate 430, the dimensions of the signal lines 410 and the ground lines 420, the distance (d) between the signal lines 410 and the ground lines 420, and the thickness of the dielectric substrate 430. Here, L denotes an inductance per unit length, and C denotes a capacitance per unit length.

As shown in FIG. 5, when the TO-CAN type package is mounted on the PCB 400 for signal transferring, in case the locations of the pins 220, 310 and 320 are deviated from designed locations by manufacturing errors, or the distance (d) between the signal lines 410 and the ground lines 420 is larger than the interval (S) between the signal-carrying pins 220 and the ground pins 310 and 320, the edges of the ground pins 310 and 320 attached to the upper surface of the PCB 400 are removed. The removal of the edges of the ground pins 310 and 320 prevents shorts occurring due to the narrow interval (S) when the signal-carrying pins 220 and the ground pins 310 and 320 of the TO-CAN type package are connected to the signal lines 410 and the ground lines 420 of the PCB 400.

Figure 6:
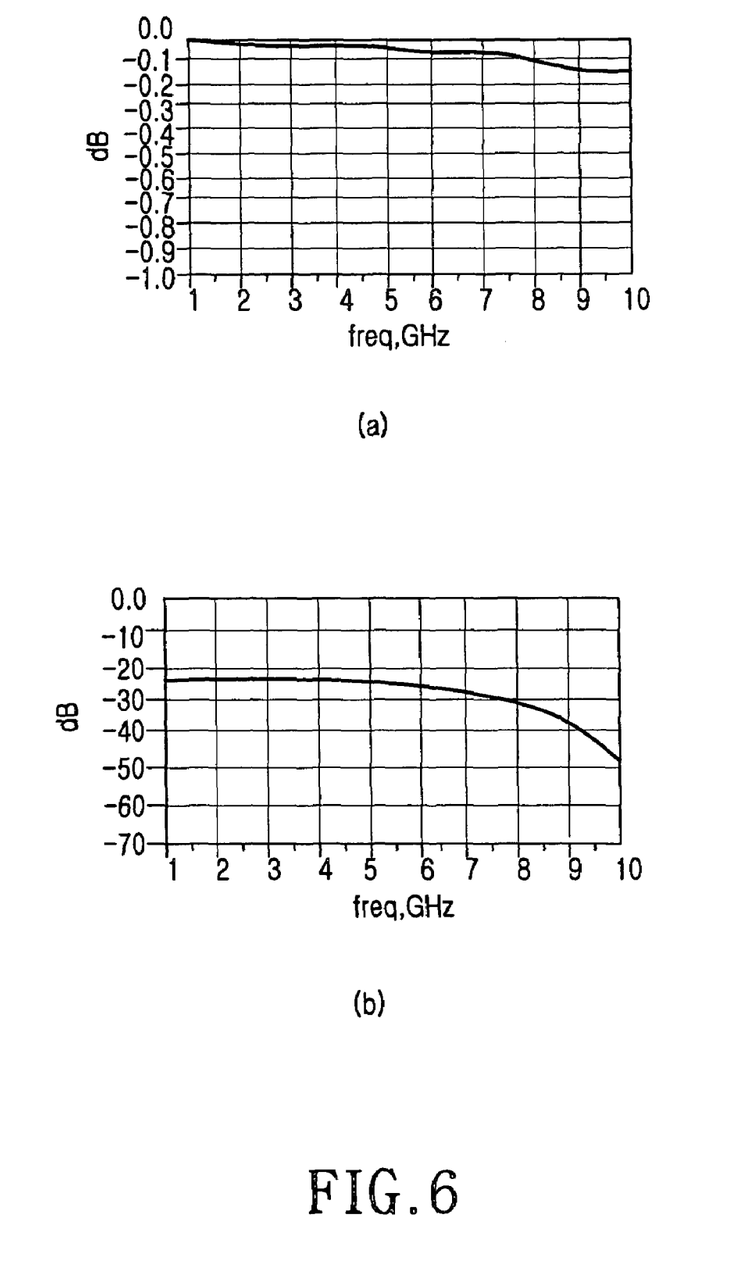
FIGS. 6a and 6b are graphs illustrating a high-frequency property of the TO-CAN type package in accordance with the preferred embodiment of the present invention.
Figure 7:
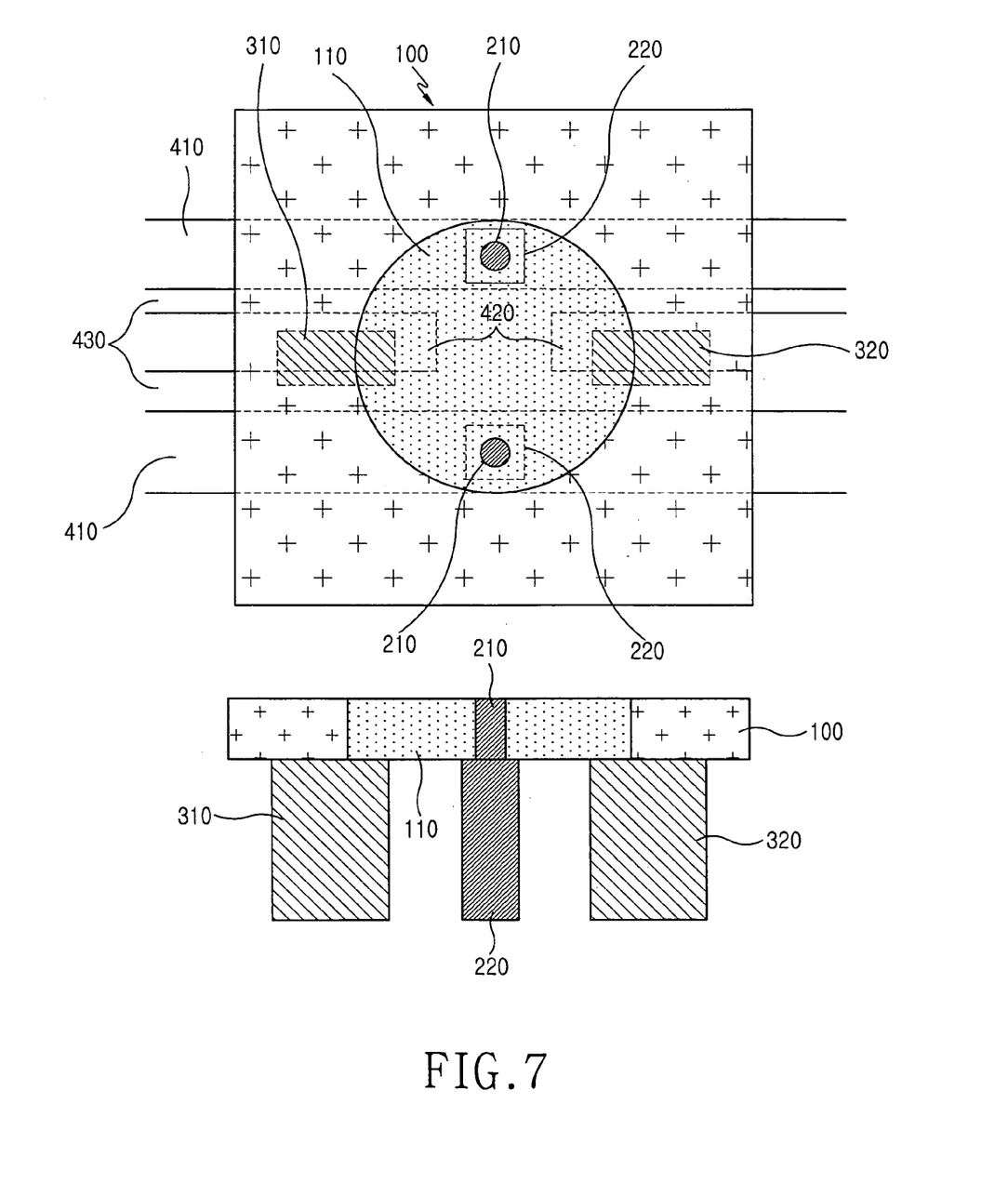
FIGS. 7 and 8 are schematical cross-sectional illustrating a connection between the TO-CAN type package and a printed circuit board (PCB) for signal processing.

FIGS. 6a and 6b are graphs illustrating a high-frequency property of the TO-CAN type package in accordance with the preferred embodiment of the present invention. That is, the characteristic impedance in the TO-CAN type package is obtained to be 50Ω as a result of the configuration of the glass-sealed interior of the through hole and the protruding portion of the pin that is protruding from the lower surface of the stem.

FIG. 6a is a graph illustrating a gain property, which represents the degree of loss of a signal. Here, the loss of the signal at 10 GHz is less than 0.2 dB. Compared to the graph in FIG. 3a, in which the loss of the signal at 10 GHz is more than 2 dB, the graph in FIG. 6a shows the improvement of the gain property of the TO-CAN type optical module of the present invention.

FIG. 6b is a graph illustrating a matching property of the glass-sealed portions. Here, the value obtained by the matching property of the TO-CAN type optical module of the present invention is less than −20 dB at from 1 GHz up to 10 GHz. Compared to the graph in FIG. 3b, the graph in FIG. 6b shows the improvement of the matching property of the TO-CAN type optical module of the present invention. The ideal value obtained by the matching property is −∞. However, when the value is less than −20 dB, it is appreciated that the present invention provides an excellent matching property.

As apparent from the above description, the present invention provides an TO-CAN type optical module, in which a glass-sealed portion around a signal-carrying pin has a desired characteristic impedance due to the impedance matching of the coaxial cable. In addition, a protruding portion of the signal-carrying pin has a desired characteristic impedance due to the thickness and width of the signal-carrying pin, the thickness and width of ground pins spaced at both sides from the signal-carrying pin, and the interval between the signal-carrying pin and the ground pins. Accordingly, it is possible to prevent the attenuation of a signal, which was generated by the structure of a glass-sealed portion and the lengths of pins of the conventional TO-CAN type optical module, while lowering the matching property, which was generated in the conventional TO-CAN type optical module. Furthermore, the present invention provides a package manufactured at low cost with a high performance in optical communication at a data transfer rate of more than 10 Gb/s by improving a high-frequency property of the package.

While the preferred embodiments of the present invention have been illustrated and described, it will be understood by those skilled in the art that various changes and modifications may be made, and equivalents may be substituted for elements thereof without departing from the true scope of the present invention. In addition, many modifications may be made to adapt to a particular situation and the teaching of the present invention without departing from the central scope. Therefore, it is intended that the present invention not be limited to the particular embodiment disclosed as the best mode contemplated for carrying out the present invention, but that the present invention include all embodiments falling within the scope of the appended claims.

What is claimed is:

1. A TO-CAN type optical module comprising:
   a stem provided with optical components mounted on its upper surface and having a hole formed therethrough;
   a plurality of pins electrically connected to the optical components via the hole, said plurality of pins including a signal-carrying pin protruding from the lower surface of said stem; and
   a pair of ground pins spaced at both ends of a protruding portion of said signal-carrying pin by a predetermined interval, wherein the edges of said ground pins are partially removed to accommodate smaller interval separating the protruding portion of said signal-carrying pin and said ground pins to the intervals separating signal lines and ground lines of a PCB for mounting the signal-carrying pin and the ground pins thereon.

2. The optical module as set forth in claim 1, wherein the interior of the hole of said stem has a desired characteristic impedance by the impedance matching of a coaxial cable.

3. The optical module as set forth in claim 1, wherein the lower surface of said stem has a desired characteristic impedance according to the dimensions of the protruding portion of said signal-carrying pin and said ground pins, and an interval between the protruding portion of said signal-carrying pin and said ground pins.

4. The optical module as set forth in claim 1, wherein said signal-carrying pin includes a cylindrical portion passing through said stem and a hexahedral portion protruding from the lower surface of said stem.

5. The optical module as set forth in claim 4, wherein edges of said ground pins are partially removed so as to prevent the occurrence of shorts when said signal-carrying pins and said ground pins are connected to said signal lines and said ground lines.

6. The optical module as set forth in claim 1, wherein a ground property of the optical module is improved by increasing the dimensions of said ground pins.

7. The optical module as set forth in claim 1, wherein the optical components are one of a laser diode (LD) and a photo diode (PD).

8. A TO-CAN type optical module comprising:
   a stem provided with optical components mounted on its upper surface and having a hole formed therethrough;
   a plurality of pins electrically connected to the optical components via the hole, said plurality of pins including a signal-carrying pin protruding from the lower surface of said stem; and
   a pair of ground pins spaced at both ends of a protruding portion of said signal-carrying pin by a predetermined interval, wherein said signal-carrying pin includes a cylindrical portion passing through said stem and a hexahedral portion protruding from the lower surface of said stem.

9. The optical module as set forth in claim 8, wherein the interior of the hole of said stem has a desired characteristic impedance by the impedance matching of a coaxial cable.

10. The optical module as set forth in claim 8, wherein the lower surface of said stem has a desired characteristic impedance according to the dimensions of the protruding portion of said signal-carrying pin and said ground pins, and an interval between the protruding portion of said signal-carrying pin and said ground pins.

11. The optical module as set forth in claim 8, wherein the edges of said ground pins are partially removed to accommodate smaller interval separating the protruding portion of said signal-carrying pin and said ground pins to the intervals separating signal lines and ground lines of a PCB for mounting the signal-carrying pin and the ground pins thereon.

12. The optical module as set forth in claim 8, wherein edges of said ground pins are partially removed so as to prevent the occurrence of shorts when said signal-carrying pins and said ground pins are connected to signal lines and ground lines.

13. The optical module as set forth in claim 8, wherein a ground property of the optical module is improved by increasing the dimensions of said ground pins.

14. The optical module as set forth in claim 8, wherein the optical components are one of a laser diode (LD) and a photo diode (PD).

15. A TO-CAN type optical module comprising:
- a stem provided with optical components mounted on its upper surface and having a hole formed therethrough;
- a plurality of pins electrically connected to the optical components via the hole, said plurality of pins including a signal-carrying pin protruding from the lower surface of said stem; and
- a pair of ground pins spaced at both ends of a protruding portion of said signal-carrying pin by a predetermined interval, wherein the lower surface of said stem has a desired characteristic impedance according to the dimensions of the protruding portion of said signal-carrying pin and said ground pins, and an interval between the protruding portion of said signal-carrying pin and said ground pins.

16. The optical module as set forth in claim 15, wherein the interior of the hole of said stem is filled with glass sealing powder, said glass-sealed hole has a desired characteristic impedance by the impedance matching of a coaxial cable.

17. The optical module as set forth in claim 16, wherein the glass-sealed hole functions as a waveguide.

18. The optical module as set forth in claim 16, wherein the glass-sealed hole has a permittivity of substantially 4.1.

19. The optical module as set forth in claim 16, wherein the edges of said ground pins are partially removed to accommodate smaller interval separating the protruding portion of said signal-carrying pin and said ground pins to the intervals separating signal lines and ground lines of a PCB for mounting the signal-carrying pin and the ground pins thereon.

20. The optical module as set forth in claim 16, wherein said signal-carrying pin includes a cylindrical portion passing through said stem and a hexaheciral portion protruding from the lower surface of said stem and edges of said ground pins are partially removed so as to prevent the occurrence of shorts when said signal-carrying pins and said ground pins are connected to signal lines and ground lines.

* * * * *